United States Patent

Kadosh et al.

[11] Patent Number: 5,866,934
[45] Date of Patent: Feb. 2, 1999

[54] PARALLEL AND SERIES-COUPLED TRANSISTORS HAVING GATE CONDUCTORS FORMED ON SIDEWALL SURFACES OF A SACRIFICIAL STRUCTURE

[75] Inventors: Daniel Kadosh, Austin; Mark I. Gardner, Cedar Creek; Jon D. Cheek, Round Rock, all of Tex.

[73] Assignee: Advanced Micro Devices, Inc.

[21] Appl. No.: 879,504

[22] Filed: Jun. 20, 1997

[51] Int. Cl.$^6$ ................................. H01L 27/11
[52] U.S. Cl. ............... 257/368; 257/369; 257/374; 257/396; 257/397; 257/408; 257/904
[58] Field of Search ................. 257/368, 369, 257/374, 396, 397, 401, 408, 904

[56] References Cited

U.S. PATENT DOCUMENTS

| | | | |
|---|---|---|---|
| 4,419,809 | 12/1983 | Riseman et al. | 29/571 |
| 4,442,589 | 4/1984 | Doo et al. | 29/571 |
| 4,460,413 | 7/1984 | Hirata et al. | 438/297 |
| 4,597,827 | 7/1986 | Nishitanit et al. | 438/227 |
| 5,041,895 | 8/1991 | Contiero et al. | 257/374 |
| 5,202,272 | 4/1993 | Hsieh et al. | 438/395 |
| 5,283,449 | 2/1994 | Ooka | 257/204 |
| 5,373,476 | 12/1994 | Jeon | 365/226 |
| 5,445,107 | 8/1995 | Roth et al. | 438/481 |
| 5,468,666 | 11/1995 | Chapman | 437/44 |
| 5,576,570 | 11/1996 | Ohsawa et al. | 257/369 |
| 5,679,971 | 10/1997 | Tamba et al. | 257/357 |

FOREIGN PATENT DOCUMENTS

| | | |
|---|---|---|
| 0186058 | 12/1985 | European Pat. Off. . |
| 0402296 | 12/1990 | European Pat. Off. . |
| 0675544 | 10/1995 | European Pat. Off. . |
| 60-066861 | 4/1985 | Japan . |
| 60-66861 | 4/1985 | Japan . |

OTHER PUBLICATIONS

No Author, "Process for Making Very Small, Asymmetric, Field–Effect Transistors", *I.B.M. Technical Disclosure Bulletin*, vol. 30, No. 3, Aug., 1987, pp. 1136–1137.

No Author, "Low Series Resistance Source by Spacer Methods," vol. 33, No. 1A, Jun. 1990, pp. 75–77.

*Primary Examiner*—William Mintel
*Attorney, Agent, or Firm*—Kevin L. Daffer; Conley, Rose & Tayon

[57] ABSTRACT

An improved series and/or parallel connection of transistors within a logic gate is presented. The improved connection is brought about by a sacrificial structure on which gate conductors are formed adjacent sidewall surfaces of the sacrificial structure. The sacrificial structure thereby provides spacing between the series-connected or parallel-connected transistors. Upon removal of each sacrificial structure, a pair of transistors can be formed by implanting dopant species into the substrate on opposite sides of the spaced conductors. Beneath what was once a sacrificial structure is a shared implant area to which two transistors are coupled either in series or in parallel. By depositing the gate conductor material and then anisotropically removing the material except adjacent the vertical sidewall surfaces, an ultra short gate conductor can be formed concurrent with other gate conductors within a logic gate.

12 Claims, 4 Drawing Sheets

PARALLEL AND SERIES-COUPLED TRANSISTORS HAVING GATE CONDUCTORS FORMED ON SIDEWALL SURFACES OF A SACRIFICIAL STRUCTURE

BACKGROUND OF THE INVENTION

1. Field of the Invention

This invention relates to transistors coupled in series and/or in parallel to form a logic gate and, more particularly, to a more accurate method for forming ultra-small gate conductors for each of the transistors.

2. Description of the Related Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal annealer ("RTA"). A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across the polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

A typical n-channel MOS ("NMOS") transistor employs n-type dopants placed into a p-type substrate. Conversely, a typical p-channel MOS ("PMOS") transistor comprises p-type dopants placed into an n-type substrate. The substrate is generally a single crystalline silicon structure. Regions of the substrate which receive dopants on opposite sides of the gate conductor are generally referred to as junction regions, and the distance between junction regions is typically referred to as the physical channel length. After implantation and subsequent diffusion of the junction regions, the distance between the junction regions becomes less than the physical channel length and is often referred to as the effective channel length ("Leff"). In high density designs, not only does the physical channel length become small, so too must the Leff. As Leff decreases below approximately 1.0 μm, for example, a problem known as short channel effects ("SCE") becomes predominant.

Integrated circuits designed with relatively small physical channel lengths in densely patterned circuit areas require careful attention be directed to the mechanism by which the gate conductor is formed. For example, if a set of gate conductors within a densely patterned area become too small, then SCE will be predominant for those transistors. It might be that the small Leff transistors will prematurely turn on or will incur sub-threshold currents, more so than the other transistors—even though all transistors were designed to have the same physical channel length.

Slight variations in gate conductor length (i.e., physical channel length) even though not intentional may drastically alter the performance of a circuit design with relatively small physical channel lengths. This problem is significant in areas of densely patterned gate conductors such as, for example, logic areas containing numerous interconnected NAND and NOR gates. While it is desired that the series-connected and parallel-connected transistors within each logic gate be closely spaced to one another, it is equally desired that those transistors maintain a consistent channel length amongst themselves. If, for example, Leff of one parallel-connected transistor differs from that of the other parallel-connected transistor, then uneven turn-on transience may occur across the parallel connection.

The conventional lithography used to pattern closely spaced gate conductors (e.g., gate conductors of series-connected and parallel-connected transistors) suffers many drawbacks. For example, selective exposure is highly dependent upon accurately placing light on the light-sensitive material. Furthermore, light-sensitive material must consistently respond to the light with fine-line resolution. Any elevational disparity on which the polysilicon resides will result in slight changes in the point at which the light impinges on the light-sensitive material. This results in a variation in the polymerized/non-polymerized boundary.

It is therefore desirable to produce gate conductors which have an extremely small physical channel length to achieve high density logic cells. Although small in physical channel length, the desired gate conductors must be of consistent size across a somewhat elevationally disparate topography. In order to accurately produce a small gate conductor, a process must be used which avoids lithographic limitations of exposure, develop and etch cycles used in defining conventional gate conductors upon a gate dielectric. In order for a transistor which employs a relatively small gate conductor to achieve commercial success, improvements must be undertaken not only to the lithography procedure but also possibly to the junction itself. It may be necessary to incorporate a lightly doped drain ("LDD") region at the interface between the junction and the channel area underlying the gate conductor. As Leff decreases commensurate with gate conductor size, LDD implants must be carefully controlled so as not to encroach into the relatively short channel while at the same time source/drain implants formed within the junctions must be sufficiently concentrated to minimize hot carrier effects ("HCE").

SUMMARY OF THE INVENTION

The problems outlined above are in large part solved by an improved transistor configuration hereof. The improved transistor can be either a p-channel or an n-channel transistor. Importantly, p-channel transistors can be incorporated with n-channel transistors to form a logic gate. The logic gate comprises series-connected and parallel-connected transistors closely spaced and connected to form, for example, one or more NAND gates or NOR logic gates.

In regions where logic gates are prevalent, closely spaced transistors are needed having relatively short physical channel lengths. To define an ultra short physical channel length which maintains its effective consistency for each transistor across one or more logic gates, the gate conductors of those transistors are beneficially formed outside the conventional lithography process. Instead of depositing a gate conductor material across an entire planar surface, the present process employs a gate conductor material formed so that it is bounded on one lateral surface against a sacrificial structure. The bounded gate conductor can be formed by depositing a layer of polysilicon across and adjacent to the sacrificial structure. The gate conductor layer is then partially removed using an at anisotropic etch technique, leaving a gate conductor which abuts the sacrificial structure. The height of the sacrificial material and the deposition thickness of the gate conductor material will define the entire gate conductor geometry.

According to one embodiment, spacers can be formed on opposed lateral surfaces of the gate conductor. The spacer on one lateral surface can be of dissimilar thickness than the spacer on the opposing lateral surface. Of benefit is the asymmetrical design of the ensuing transistor, wherein the drain-side spacer can be made thicker than the source-side spacer. Since the spacers define source/drain implant alignment, dissimilar spacer thicknesses will cause the drain implant area to be spaced farther away from the gate conductor than that of the source implant area.

The sacrificial material is patterned at a specific location upon a dielectric-covered semiconductor substrate. The material is sacrificial in that it later purposefully is removed from the dielectric-covered topography. The sacrificial structure includes a pair of opposed sidewall surfaces. Those sidewall surfaces serve as receptors against which a gate conductor is later formed. The sacrificial material is patterned such that it may reside over what will be a shared junction. Subsequent to forming gate conductors on opposed sidewall surfaces of a sacrificial material, and removing the sacrificial material, a dopant is placed in the region beneath where the sacrificial material once resided. The dopant is common to either the source or drain junction of the pair of transistors formed on opposing sidewall surfaces. Accordingly, each patterned, sacrificial material defines a mutual junction and a pair of gate conductors within a series-connected or a parallel-connected pair of transistors.

Gate conductors are formed by preferably depositing a polysilicon material across the upper and sidewall surfaces of the patterned, sacrificial material. An anisotropic etch, according to a preferred embodiment, comprises an ion-directed or ion-assisted plasma etch. The anisotropic etch is used to remove the polysilicon horizontal surfaces faster than polysilicon vertical surfaces. After the horizontal surfaces are completely removed from the sacrificial material and from the semiconductor topography a spaced distance from the sacrificial material, what remains is a gate conductor on the sidewall surfaces immediately adjacent the substantially vertical sidewall surfaces of the sacrificial material. The height of the gate conductor is dependent upon the height of the sacrificial material, whereas the thickness (or width) of the gate conductor measured from the sacrificial structure sidewall surfaces is dependent on the polysilicon deposition thickness as well as the anisotropic etch composition and duration. If the deposition thickness is quite large and the etch is minimal, the gate conductor can have a width which is relatively large. That width, which defines a channel length or Leff, is commensurately large.

Of prime importance is the avoidance of using conventional lithography to define physical channel length, or gate width. Instead, the present process uses lithography only to define an edge (i.e., sacrificial structure sidewall surface) of the gate conductor. Deposition and blanket anisotropic etch back is thereafter used to define the other edge of the gate conductor. Accordingly, the present gate conductors are configured using a combination of lithography and deposition techniques. The deposition can be performed at a slow rate so as to more carefully control, with fine-line resolution, the overall width of the ensuing gate conductor.

Broadly speaking, the present invention contemplates a logic gate. The logic gate is formed having a pair of closely spaced transistors which will be connected either in series or in parallel. Importantly, the spacing between transistors, and specifically, the spacing between transistor gate conductors is determined by the width between sidewall surfaces of a patterned sacrificial material.

According to one embodiment, a pair of sacrificial structures are formed by patterning a layer of sacrificial material. The sacrificial structures are spaced from each other upon the gate dielectric. Each of the pair of sacrificial structures includes a pair of opposed sidewall surfaces. A first pair of gate conductors extends across the gate dielectric laterally from the sidewall surfaces of one of the pair of sacrificial structures. A second pair of gate conductors extends across the gate dielectric laterally from sidewall surfaces of another of the pair of sacrificial structures. A first set of four implant areas are formed a spaced distance from each other within the semiconductor substrate after removal of one of the pair of sacrificial structures. The first set of implant areas are aligned with opposing edges of the first pair of gate conductors. Beneficially two of the four implant areas of the first set may be shared as a contiguous junction area between the first pair of gate conductors. A second set of four implant areas may also be formed a spaced distance from each other within the semiconductor substrate after removal of another of the pair of sacrificial structures. The second set of implant areas are aligned with opposing edges of the second pair of gate conductors, wherein two of the four implant areas of the second set of implant areas may be formed contiguous with one another similar to contiguous implants of the first set of four implant areas.

The present invention further contemplates a method for forming a logic gate. The method comprises patterning a sacrificial material to form first and second sacrificial structures. The first and second sacrificial structures comprise a first pair and a second pair of opposed sidewall surfaces, respectively, extending substantially perpendicular from a dielectric-covered semiconductor substrate. A gate conductor is deposited across the first and second sacrificial structures. The gate conductor material can then be removed except immediately adjacent the first pair and the second pair of opposed sidewall surfaces. What remains is a first pair of gate conductors and a second pair of gate conductors extending from the first and second pairs of opposed sidewall surfaces, respectively. A first dopant is then implanted into the semiconductor substrate in alignment with the lateral surface of the first pair of gate conductors while a second dopant is implanted into the semiconductor substrate in alignment with a lateral surface of the second pair of gate conductors. The first dopant may be of opposite impurity type than the second dopant. An interlevel dielectric may be formed upon the first and second pairs of gate conductors. Openings may be patterned through the interlevel dielectric and interconnect arranged upon the interlevel dielectric to form, e.g., a series-connected pair of n-channel transistors and a parallel-connected pair of p-channel transistors. Alternatively, the interconnect can be patterned to form a series-connected pair of p-channel transistors and a parallel-connected pair of n-channel transistors. In the former instance, a NAND gate can occur while in the latter instance a NOR gate can occur.

BRIEF DESCRIPTION OF THE DRAWINGS

Other objects and advantages of the invention will become apparent upon reading the following detailed description and upon reference to the accompanying drawings in which.

Figures 1, 2:
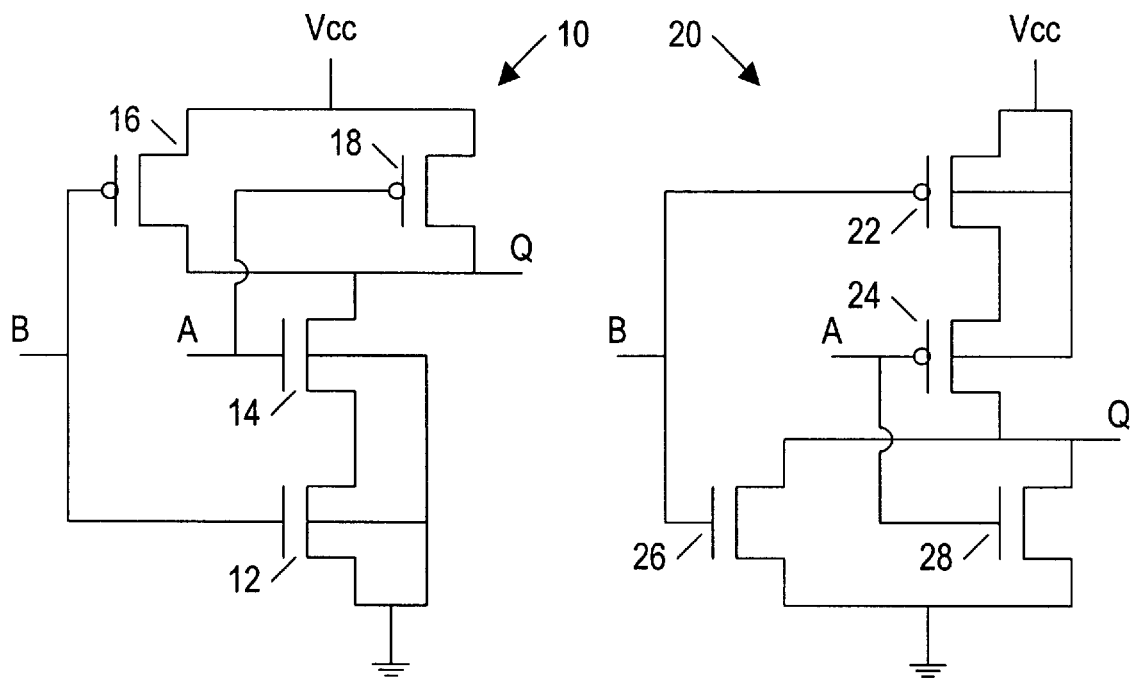
FIG. 1 is a circuit schematic of series-connected, n-channel transistors and parallel-connected, p-channel transistors embodied within a NAND gate.
FIG. 2 is a circuit schematic of a series-connected, p-channel transistors and parallel-connected n-channel transistors embodied within a NOR gate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates pairs of series-connected, n-channel transistors and parallel connected, p-channel transistors within a NAND gate 10. NAND gate 10 is shown as a two-input example. The n-channel transistors are depicted as reference numerals 12 and 14 connected between a ground potential and an output Q. The p-channel transistors are depicted as reference numerals 16 and 18 connected between a power supply $V_{cc}$ and output Q. Conductive paths within the transistors are modulated by inputs A and B. Multiple input NAND gates are prevalent throughout a core logic section of, for example, numerous integrated circuits including microprocessors and microcontrollers. Series-connected transistors illustrate a source junction of transistor 14 shared with a drain junction of transistor 12. Meanwhile, parallel connections indicate mutually connected source junctions of transistors 16 and 18, along with mutually connected drainjunctions of transistors 16 and 18. Mutual connection beneficially reduces topological area if performed by a single, contiguous implant area. The contiguous implant area beneficially occurs beneath a patterned sacrificial structure as will be described below.

FIG. 2 illustrates a NOR gate 20. NOR gate 20 embodies series-connected p-channel transistors 22 and 24 connected between the power supply $V_{cc}$ and output Q. Additionally, a pair of n-channel transistors 26 and 28 are coupled in parallel between output Q and ground.

Similar to the series-connected and parallel-connected transistors of NAND gate 10, pairs of series-connected and parallel-connected transistors of NOR gate 20 are spaced by a sacrificial structure. The sacrificial structure not only dimensions the spacing between gate conductors of transistor pairs, but also defines the mutual, or shared junction. The shared junction is the source and drain connection between series-connected transistors or the power supply/ground (or output Q) of the parallel-connected transistors. The mechanism for forming the sacrificial structure, and aligning the gate conductor pairs for high density, ultra short gate conductors is further described in reference to the processing steps shown in FIGS. 3–13.

Figure 3:
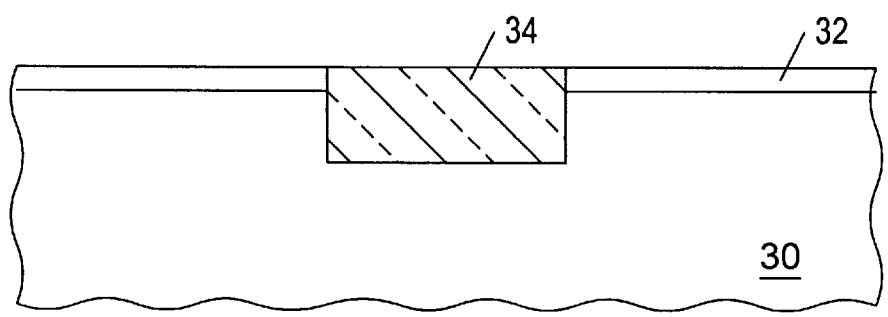
FIG. 3 is a partial cross-sectional view of a semiconductor topography comprising a substrate coated with a gate oxide and an isolation structure placed between active areas within the substrate.

FIG. 3 is a partial cross-sectional view of a semiconductor topography comprising substrate 30 coated with a gate oxide 32. Gate oxide 32 is preferably thermally grown on the silicon-based substrate 30 in regions exclusive of an isolation structure 34. Structure 34 serves to electrically isolate active areas, and is preferably formed either by the shallow trench process or by LOCOS. Regardless of how it is formed, the isolation structure comprises a dielectric which is of sufficient thickness to prevent inversion beneath the structure whenever substantially large voltages are applied to interconnect extending above the structure.

Figure 4:
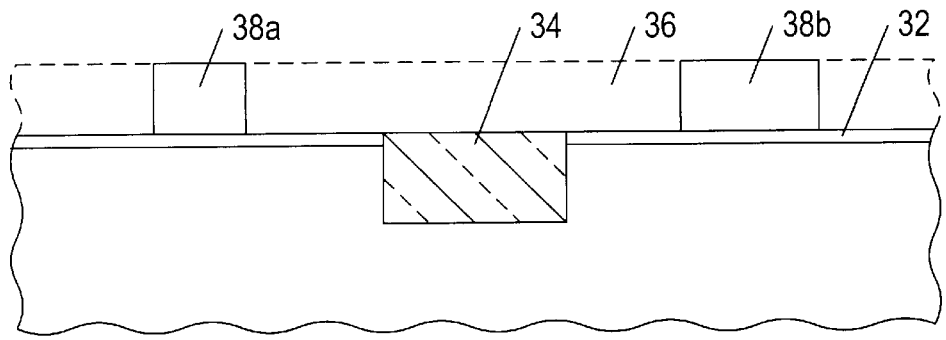
FIG. 4 is a partial cross-sectional view of the semiconductor topography, wherein sacrificial structures are patterned upon the gate oxide in a processing step subsequent to FIG. 3.

FIG. 4 illustrates a processing step subsequent to FIG. 3, wherein a sacrificial material 36 is blanket deposited entirely across gate oxide 32 and isolation structure 34. Material 36 is formed from any chemical composition which can be either applied in solid form or cured to a solid form which is thereafter receptive to patterned etching. According to one embodiment, material 36 is a spin-on dielectric, or a dielectric applied by chemical vapor deposition ("CVD"). Once applied, material 36 is patterned using well-known lithography techniques to leave sacrificial structures 38 spaced from each other upon gate oxide 32.

Sacrificial structures 38 are exposed to a deposition cycle at which a gate conductor material 40 is blanket deposited across the upper surfaces 42 and the sidewall surfaces 44 in addition to it being deposited across gate oxide 32 and isolation structure 34. According to one embodiment, gate conductor material 40 comprises polycrystalline silicon deposited from a CVD process. The thickness by which material 40 is deposited can vary depending on the amount of lateral extension needed from sidewall surfaces 44 to form an ensuing gate conductor. The greater the thickness, the greater the physical channel length might be.

Figure 5:
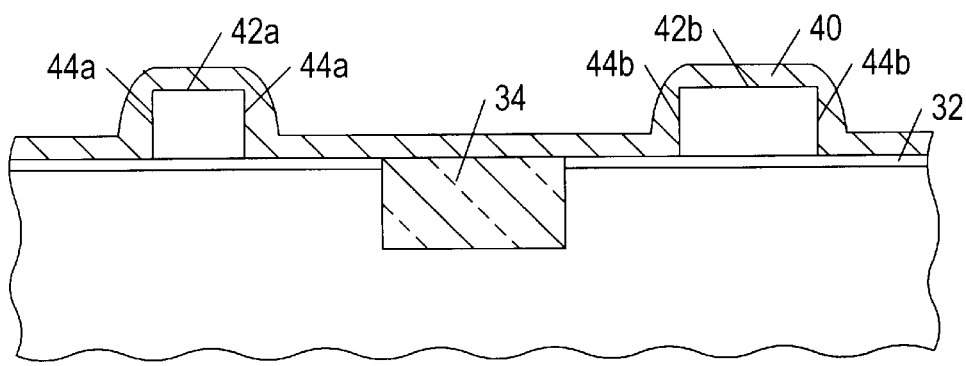
FIG. 5 is a partial cross-sectional view of the semiconductor topography, wherein a polysilicon material is blanket deposited across the sacrificial structures, the gate oxide and the isolation structure in a processing step subsequent to FIG. 4.
Figure 6:
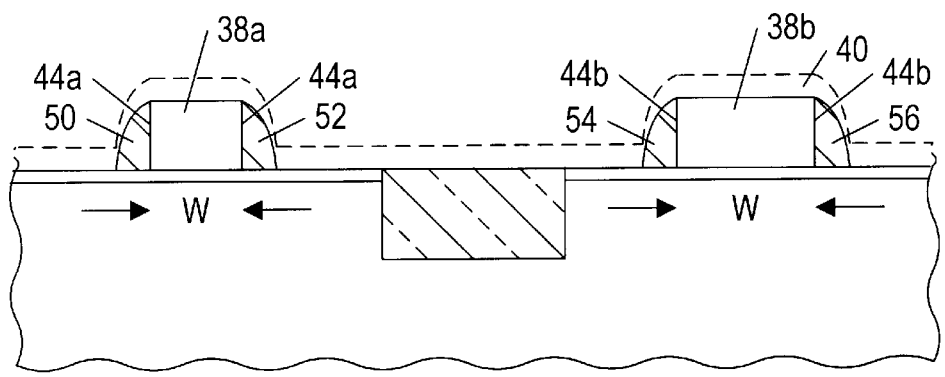
FIG. 6 is a partial cross-sectional view of the semiconductor topography subjected to a blanket anisotropic etch for removing the polysilicon material from the horizontal surfaces while retaining polysilicon material on vertical surfaces adjacent sidewall surfaces of the sacrificial structures in a processing step subsequent to FIG. 5.

FIG. 6 illustrates a processing step subsequent to FIG. 5, wherein a first pair of gate conductors 50 and 52 are formed on opposing sidewall surfaces 44a of one sacrificial structure 38a, while another pair of gate conductors 54 and 56 are formed on opposing sidewall surfaces 44b of the other sacrificial structure 38b. The spacing between gate conductors 50 and 52 may be dissimilar from the spacing between gate conductors 54 and 56. That spacing is dictated by the width W of sacrificial structures 38.

Gate conductors 50 through 56 are formed by directionally etching gate conductor material 40 at a greater rate along horizontal surfaces than along vertical surfaces. More specifically, an ion-assisted etch is applied, whereby both mechanical and chemical removal species are applied at an angle primarily along an axis perpendicular to gate oxide 32 and upper surface 42. Resulting from the directional (or anisotropic) etch, material 40 is removed from upper surfaces 42 and from gate dielectric 32 a spaced distance from sidewall surfaces 44. What remains is material adjacent the sidewall surfaces and extending from those surfaces a defined distance. That distance is determined from the etch duration and initial thickness of material 40 as deposited. Various ion-assisted, anisotropic etch compositions and equipment tools used in directionally removing polysilicon are recognized as a popular etch technique. However, application of an anisotropic etch for the purpose described herein imparts unique and beneficial results whenever short physical channel lengths are needed in high density, logic gate layouts.

Figure 7:
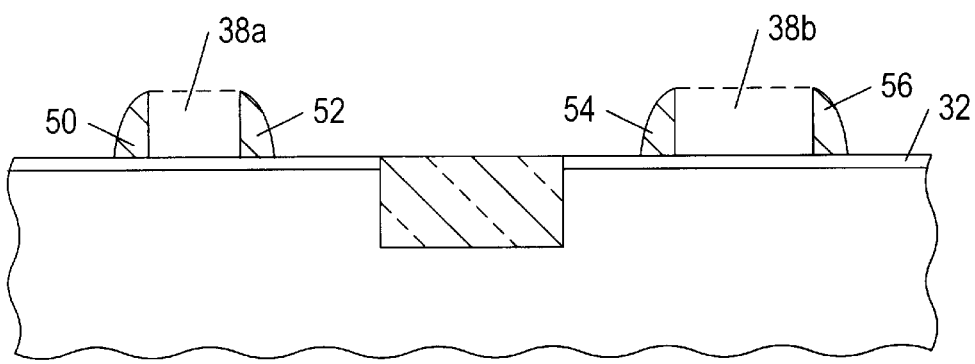
FIG. 7 is a partial cross-sectional view of the semiconductor topography, wherein the sacrificial structures are removed in a processing step subsequent to FIG. 6.

FIG. 7 illustrates the removal of sacrificial structures 38. Structures 38 are made of a material which can be selectively removed relative to adjacent gate oxide 32 and gate conductors 50 through 56. According to one embodiment, sacrificial structures 38 comprise silicon nitride, silicon dioxide, silicon oxynitride and phosphorous doped glass. Removal can be carried out, for example, by a wet-chemical etching solution. A suitable oxide etch may involve an ammonium fluoride, buffered HF solution or a hydroxide. Silicon nitride can be removed using, for example, a plasma etch. Wet chemical etching can be chosen so that it is highly selective to removing only the sacrificial structures 38 but not the adjoining structures made of dissimilar compositions. If, for example, structures 38 are oxide, the oxide is formed by a deposition process altogether different from the thermally grown gate oxide. Thus, a wet-chemical etch can be chosen to remove deposited oxide at a much higher rate than underlying, thermally grown oxide. It is generally known that a pure CVD oxide as deposited etches faster than a thermal oxide because, in part, of the structural defects within the CVD oxide relative to the thermally grown oxide. As the silicon content of the deposited oxide increases, the etch rate in HF decreases. It therefore may be important to decrease the silicon content of the deposited oxide to enhance its etch rate in HF relative to underlying thermally grown oxide which generally has $SiO_2$ in stoichiometric proportions. The addition of arsenic or phosphorous to the deposited oxide increases the etch rate in HF or buffered HF.

Figure 8:
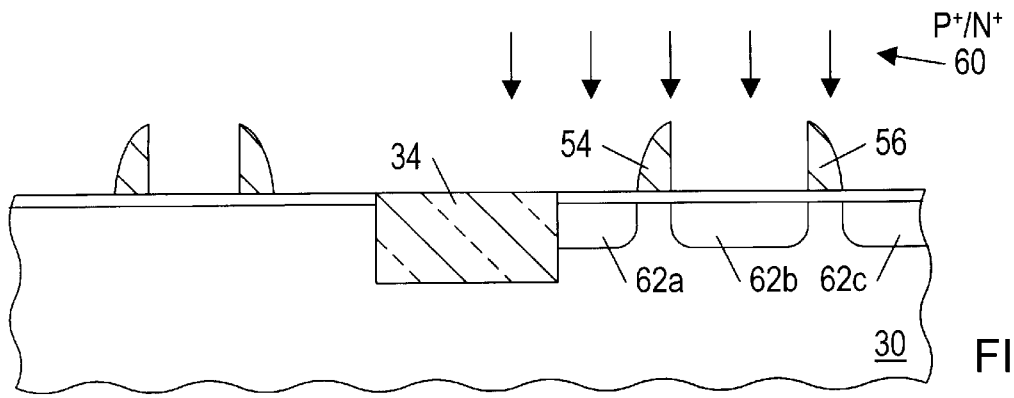
FIG. 8 is a partial cross-sectional view of the semiconductor topography, wherein LDD or source/drain dopants are implanted into a first set of select regions of the substrate in a processing step subsequent to FIG. 7.

FIG. 8 illustrates selective implant into one or more active areas. A masking material (not shown) is used to provide selective implants. The patterned masking material prevents ingress of the implant species in certain areas. The implant is shown as reference numeral 60 and can comprise either p-type or n-type impurities. Gate conductors 54 and 56 mask implant 60 so that the ensuing junctions 62 are self aligned to gate conductors 54 and 56. Implant 60 is preferably a shallow implant, and can be of either light or heavy concentration.

Figure 9:
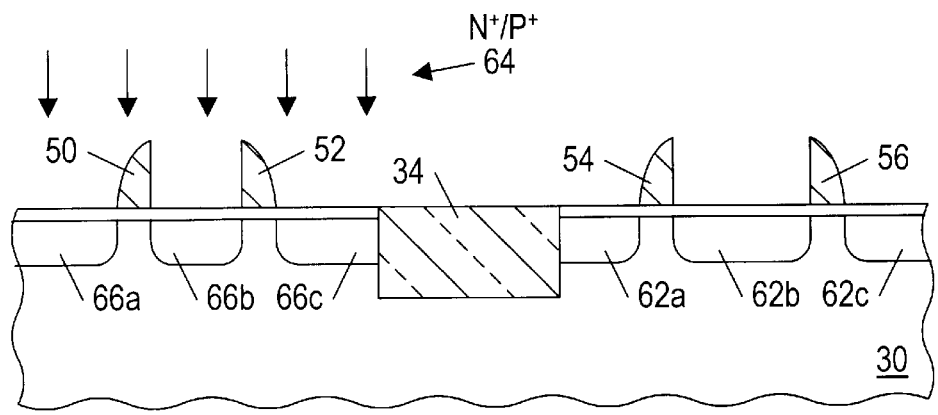
FIG. 9 is a partial cross-sectional view of the semiconductor topography, wherein LDD or source/drain dopants are implanted into a second set of select regions of the substrate in a processing step subsequent to FIG. 8.

FIG. 9 illustrates a subsequent implant step using n-type or p-type implant species 64. If implant 60 comprises p-type species, then implant 64 may comprise n-type species. Conversely, if implant 60 comprises n-type species then implant 64 may comprise p-type species. Gate conductors 50 and 52 provide masking of implant 64 to allow self-alignment of the ensuing junctions 66. Implant 64 is forwarded only in areas absent a masking layer (not shown). The masking layer used to mask implant 64 is opposite (or reverse) that used to mask implant 60. The lateral boundary of the patterned masking layer can be anywhere over isolation structure 34 since, in fact, structure 34 offers masking of implants 60 and 64 from entering substrate 30 beneath structure 34. Similar to junctions 62, junctions 66 are placed at a relatively shallow depth within substrate 30. The concentration of junctions 62 and 66 can be light or either heavy depending on whether a lightly doped drain ("LDD") is used. If an LDD is utilized, then implants 60 and 64 comprise the LDD implant species, and therefore the implant concentration is relatively light having a relatively shallow peak concentration density.

Figure 10:
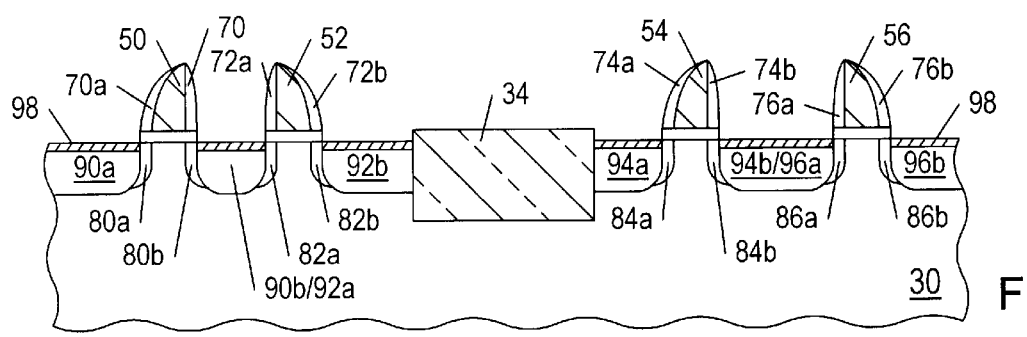
FIG. 10 is a partial cross-sectional view of the semiconductor topography, wherein the LDD and source/drain dopants are shown along with sidewall spacers and silicide of two pairs of transistors.

FIG. 10 illustrates the culmination of both an LDD implant and a source/drain implant within junction areas 62 and 66. Junction areas 62 and 66 are therefore considered graded junctions having both an LDD implant and a source/drain implant. The first implant (LDD implant) can be that shown in FIGS. 8 and 9. A subsequent source/drain implant occurs after sidewall spacers are formed on sidewall surfaces of gate conductors 50 through 56. Sidewall spacers are shown as reference numerals 70 through 76, respectively. Sidewall spacers 70 through 76 may be configured having dissimilar lateral thicknesses depending on which opposing surface of gate conductors 50 through 56 the spacer material accumulates upon. For example, spacer 70b may be thicker in lateral dimension than spacer 70a. Likewise, spacers 72a, 74b and 76a may be thicker in lateral dimension than spacer 72b, 74a and 76b, for example. The dissimilar spacer dimension may cause an asymmetrical transistor to form, whereby the LDD regions 80 through 86 may be dissimilarly sized depending on whether those regions reside on the source or drain side of the ensuing transistor. While LDD regions 80 through 86 are self-aligned to the lateral edges of gate conductors 50 through 56, respectively, source/drain regions 90 through 96 are self-aligned to the sidewall spacers 70 through 76, respectively.

Referring to FIGS. 7 and 10, it is recognized that an asymmetrical transistor can be formed by retaining the sacrificial structures 38 during a lightly doped drain (LDD) implant. Sacrificial structures 38 provide a mask against LDD implant only in the contiguous areas between transistors. The areas not masked receive the LDD aligned with one lateral surface of each gate conductor (i.e., the lateral surface which has an arcuate shape). It is not until the LDD implant is complete that the sacrificial structure 38 is removed. A source/drain implant can then occur subsequent to possibly forming spacers on one or both sidewall surfaces of each gate conductor. A graded junction occurs with the grade being greater on, for example, one side of the transistor as opposed to the other.

The combination of source/drain regions 90 through 96 and LDD regions 80 through 86 comprise junction areas. Furthermore, certain LDD and source/drain areas are contiguous from one transistor to another. Such is the case for source/drain area 90b/92a and 94b/94a. The shared junction is beneficial when forming series-connected or parallel connected transistors found, for example, in high density logic areas.

In addition to possible graded junctions shown in FIG. 10, a self-aligned silicide ("salicide") may also be formed post spacer and source/drain implant. The salicide is shown as reference numeral 98 extending along the silicon-based upper surface but not upon the oxide covered (spacer covered) gate conductors 50 through 56. Salicide 98 can be formed by reacting a metal deposited entirely across the silicon-based topography and spaced gate conductors. The metal may be a refractory metal, such as titanium, which reacts during a temperature cycle with the silicon atoms but not substantially with silicon bonded with oxygen. The unreacted metal is removed from areas prevalent with, e.g., oxygen atoms. The reacted metal remains and is annealed at a higher temperature to enhance the conductivity of the ensuing salicide. Accordingly, salicide 98 provides low resistance conductivity between the source/drain areas 90–96 and the interconnect drawn upon salicide 98 in subsequent processing steps.

Figure 11:
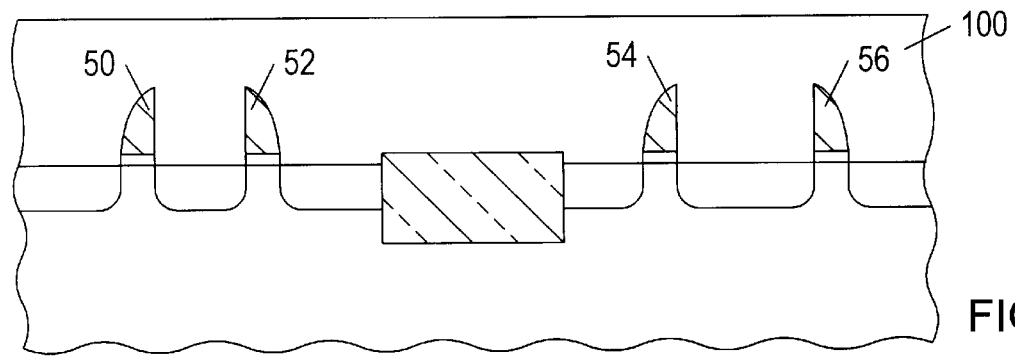
FIG. 11 is a partial cross-sectional view of the semiconductor topography, wherein an interlevel dielectric is deposited and planarized upon the gate conductors, implanted substrate and isolation structure in a processing step subsequent to FIG. 9 or 10.

Turning now to FIG. 11, an interlevel dielectric 100 is deposited and planarized upon an upper topography. The upper topography comprises gate conductors 50 through 56 either with or without sidewall spacers 70 through 76, respectively. For the sake of brevity and clarity in the drawings, spacers 70 through 76 are not shown. However, it is understood that spacers can exist along with salicide 98, between the spacers. The interlevel dielectric includes any silicon-based material such as, for example, oxide or silica, possibly containing small amounts of dopants therein. Dielectric 100 can therefore be either plasma deposited, chemical vapor deposited or spin-on deposited, possibly followed by a planarization step using either etch back, selective etch back, or chemical mechanical polish ("CMP").

Figure 12:
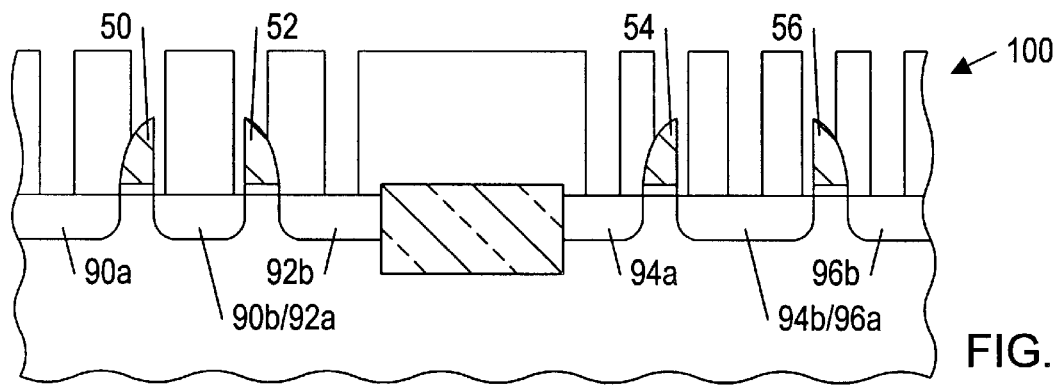
FIG. 12 is a cross-sectional view of the semiconductor topography, wherein select portions of the interlevel dielectric is removed to the underlying surfaces in a processing step subsequent to FIG. 11.

Turning now to FIG. 12, portions of interlevel dielectric 100 are removed to the underlying surface material on which interlevel dielectric 100 was previously placed. Removal involves etching, preferably with an anisotropic etch, whereby horizontal surfaces are removed at a faster rate than vertical surfaces. This leaves a relatively vertical sidewall of the ensuing etch window. The etch pattern can be changed depending on which feature beneath the interlevel dielectric is to receive a conductive material. In the example provided, each gate conductor 50 through 56 is exposed by the selective etching of interlevel dielectric 100. The lithographic masking material used to expose gate conductors 50 through 56 can further be used to expose various junctions 62 and 66, or source/drain areas 90 through 96 of those junctions.

The etch mask used in etching through interlevel dielectric 100 is aligned so that a substantial portion of various gate conductors can be exposed, possibly including a sidewall surface of one or more gate conductors. The etch mask is further aligned to expose silicon near the center of one or more source/drain implant areas 90 through 96. Preferably, the wafers lie flat on one of a pair of electrodes and a plasma is generated between the electrodes. Biasing the electrodes by a DC voltage or an RF voltage occurs while pressurizing the chamber in which the plasma is derived. The reactive ions are forced perpendicular to the wafer surface. Ions deviating from perpendicular placement will depend on the amount of scattering, which in turn depends on the mean free path length relative to the width of the sheath (dark spacing). The resulting ion bombardment causes a mechanical etching of the upper surface along an axis substantially perpendicular to the wafer topography, or interlevel dielectric 100. Anisotropic etching therefore is somewhat the result of sputtering combined with plasma energy to enhance the ion reactivity at the interlevel dielectric surface.

Figure 13:
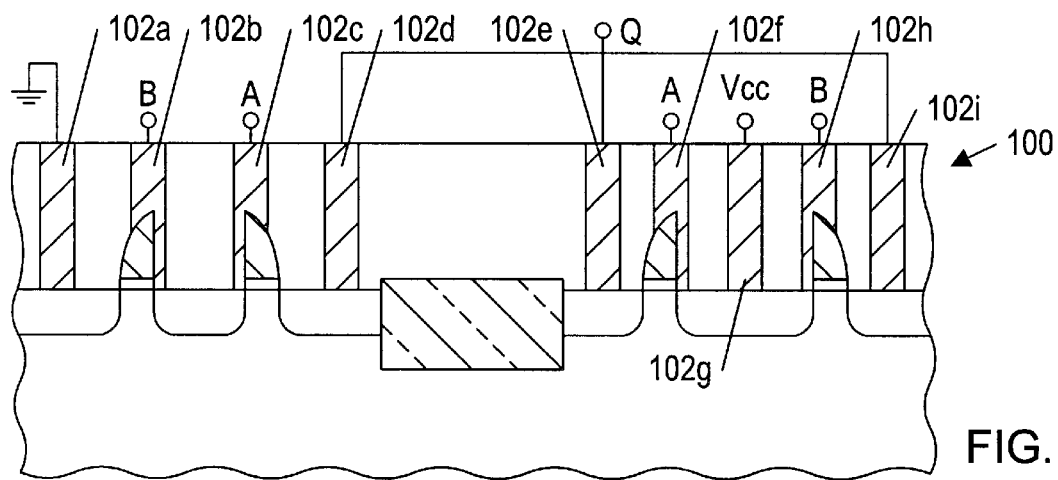
FIG. 13 is a partial cross-sectional view of the semiconductor topography, wherein the removed portions of the interlevel dielectric are filled with a plug material and the plug material is thereafter selectively connected with a metalization layer to form a NAND gate or a NOR gate such as that shown in FIGS. 1 and 2.

FIG. 13 illustrates a conductive material blanket deposited across interlevel dielectric 100. Thereafter, the material is removed from the upper surfaces of dielectric 100 using either an etchback or CMP technique. What remains is a conductive plug 102 bounded exclusively within the etched regions of interlevel dielectric 100. Numerous conductive plugs 102 may be formed entirely through interlevel dielectric 100 to underlying conductive regions (gate conductors and electrically activated implant regions). The plug material can be chosen to fill etched areas which are relatively deep compared to their width. According to one embodiment, the conductive plug material may comprise tungsten, or a combination of tungsten and titanium.

Once conductive plugs 102 are formed, a layer of metal is placed entirely across plugs 102 and the upper surface of interlevel dielectric 100. The metal layer may preferably comprise an aluminum-based material, such as aluminum silicide. The metal layer is then patterned using lithography techniques, whereby one end or a portion of an ensuing interconnect is coupled to one of the plugs 102, while the other end is coupled to receive power, ground, output Q, or input A or B.

FIG. 13 illustrates interconnect routed to plugs 102 and, specifically, to underlying conductive structures to produce a NAND gate, such as the two-input NAND gate shown in FIG. 1. Specifically, source/drain implant areas 90 and 92 are n-type, and source/drain implants 94 and 96 are p-type. Implant 90a is coupled to ground via conductive plug 102a, and implant 92b is coupled to output Q via plug 102d. Plugs 102b and 102c provide coupling of inputs A and B to the gate conductors 50 and 52 of the series-connected n-channel transistors. Series connection is brought about by mutual sharing of the drain of one transistor by the source of the other transistor at source/drain implant area 90b/92a.

Parallel-connected transistors are shown in reference to transistors connected between implants 94a/96b and implants 94b/96a. Transistors, whose gate conductors are coupled to receive inputs A and B via conductive plugs 102f and 102h, are connected in parallel between Vcc and output Q. Vcc makes connection to the shared source/drain 94b/96a and output Q makes the connection to both source regions 94a and 96b via conductive plugs 102e and 102i.

It is understood that interconnection between plugs and to various input, power, ground, and output nodes can be modified to achieve any multiple-input, series-connected or parallel-connected circuit. A two-input NAND gate or NOR gate is but one example. More than two inputs, and therefore, more than two transistors connected in series or in parallel can fall within the spirit and scope of the present invention.

Various modifications and changes may be made to each and every processing step without departing from the spirit and scope of the invention providing the series-connection or parallel-connection concepts, and the use of sacrificial structures, set forth in the claims are retained. It is intended that the following claims be interpreted to embrace all such modifications and changes and, accordingly, the specification and drawings are to be regarded in an illustrative rather than a restrictive sense.

What is claimed is:

1. A semiconductor topography, comprising:
   a gate dielectric formed upon a semiconductor substrate;
   a pair of sacrificial structures spaced from each other upon the gate dielectric, each of the pair of sacrificial structures including a pair of opposed sidewall surfaces;
   a first pair of gate conductors extending across the gate dielectric laterally from sidewall surfaces of one of the pair of sacrificial structures; and
   a second pair of gate conductors extending across the gate dielectric laterally from sidewall surfaces of another of the pair of sacrificial structures.

2. The semiconductor topography as recited in claim 1, wherein said first and second pairs of gate conductors comprise polycrystalline silicon.

3. The semiconductor topography as recited in claim 1, wherein said sidewall surfaces of said sacrificial structures extend a distance substantially perpendicular to a plane formed by a surface of the gate dielectric.

4. The semiconductor topography as recited in claim 3, wherein said first and second pairs of gate conductors have a height substantially equal to a height of the sacrificial structures.

5. The semiconductor topography as recited in claim 1, wherein said first and second pairs of gate conductors are formed above channel regions of said semiconductor substrate and wherein said first and second pairs of gate conductors have a width substantially equal to a channel length of said channel regions.

6. The semiconductor topography as recited in claim 1, wherein the pair of sacrificial structures extend above junction regions of the semiconductor substrate.

7. The semiconductor topography as recited in claim 1, wherein the pair of sacrificial structures comprise a material selected from the group consisting of chemical compositions that can be deposited in solid form and chemical compositions that can be cured to a solid form which can be etched by patterned etching.

8. The semiconductor topography as recited in claim 1, wherein the pair of sacrificial structures comprise a material selected from the group consisting of dielectric materials that can be spin-on deposited and dielectric materials that can be chemical vapor deposited.

9. The semiconductor substrate as recited in claim 1, wherein the pair of sacrificial structures comprise a material selected from the group consisting of silicon nitride, silicon oxide, silicon oxynitride, and phosphorous doped glass.

10. The semiconductor substrate as recited in claim 1, wherein the pair of sacrificial structures comprise a material that can be selectively removed while the gate dielectric, the first pair of gate conductors, and the second pair of gate conductors are retained.

11. The semiconductor substrate as recited in claim 1, wherein the first pair of gate conductors are separated by a first width, and wherein the second pair of gate conductors are separated by a second width, and wherein the first width is different from the second width.

12. The semiconductor substrate as recited in claim 1, wherein the first pair of gate conductors are separated by a first width, and wherein the second pair of gate conductors are separated by a second width, and wherein the first width is equal to the second width.

* * * * *